(12) United States Patent
Zampini

(10) Patent No.: US 6,645,695 B2
(45) Date of Patent: Nov. 11, 2003

(54) PHOTORESIST COMPOSITION

(75) Inventor: Anthony Zampini, Westborough, MA (US)

(73) Assignee: Shipley Company, L.L.C., Marlborough, MA (US)

(*) Notice: Subject to any disclaimer, the term of this patent is extended or adjusted under 35 U.S.C. 154(b) by 2 days.

(21) Appl. No.: 09/948,528

(22) Filed: Sep. 7, 2001

(65) Prior Publication Data

US 2002/0051928 A1 May 2, 2002

Related U.S. Application Data

(60) Provisional application No. 60/234,652, filed on Sep. 22, 2000, and provisional application No. 60/231,640, filed on Sep. 11, 2000.

(51) Int. Cl.$^7$ .............................................. G03F 7/004
(52) U.S. Cl. .................... 430/270.1; 430/138; 430/326
(58) Field of Search .......................... 430/138, 270.1, 430/326

(56) References Cited

U.S. PATENT DOCUMENTS

| | | | |
|---|---|---|---|
| 4,876,172 A | * | 10/1989 | Hillenbrand ................ 430/253 |
| 4,910,115 A | * | 3/1990 | Simpson et al. ............ 430/138 |
| 6,027,854 A | | 2/2000 | Nishi et al. |
| 6,114,462 A | | 9/2000 | Watanabe et al. |

FOREIGN PATENT DOCUMENTS

| | | |
|---|---|---|
| EP | 0 843 220 A1 | 5/1998 |
| EP | 0 908 783 A1 | 4/1999 |
| EP | 1 033 624 A1 | 9/2000 |
| EP | 1 182 506 A1 | 2/2002 |

OTHER PUBLICATIONS

Allen R D et al., "Protecting Groups for 193nm Photoresists", Proceedings of the SPIE, SPIE, Bellingham, VA, US, vol. 2724, 1996, pp. 334–343, XP000912221.

International Search Report of corresponding International application No. PCT/US01/28195.

* cited by examiner

Primary Examiner—Rosemary Ashton
(74) Attorney, Agent, or Firm—S. Matthew Cairns

(57) ABSTRACT

Disclosed are new photoresist compositions including polymeric particles as binders and a photoactive component. Also disclosed are methods of forming relief images using these photoresist compositions.

40 Claims, 2 Drawing Sheets

POLYMER PARTICLE MORPHOLOGY AND SRUCTURE

TETRAHEDRAL

RASPBERRY

MULTILOBES

STRUCTURE

UNIFORM

EGG-SHELL

EGG-WHITE

EGG-YOLK

PHOTORESIST COMPOSITION

This application claims the benefit of U.S. Provisional Application(s) No(s).:

| APPLICATION NO(S): | FILING DATE |
|---|---|
| 60/231,640 | Sep. 11, 2000 |
| 60/234/652 | Sep. 22, 2000 |

BACKGROUND OF THE INVENTION

The present invention relates generally to the field of photoresist compositions. In particular, the present invention relates to polymer compositions useful in photoresist compositions.

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or cross-link in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble. In general, photoresist compositions include at least a resin binder component and a photoactive agent.

More recently, chemically-amplified type resists have been increasingly employed, particularly for formation of sub-micron images and other high performance applications. Such photoresists may be negative-acting or positive-acting and generally include many cross-linking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups comprising a photoresist binder backbone. See, for example, U.S. Pat. Nos. 5,075,199; 4,968,581; 4,810,613; and 4,491,628 and Canadian Patent Application 2,001,384. Upon cleavage of the blocking group through exposure of a coating layer of such a resist, a polar functional group is formed, e.g. carboxyl or imide, which results in different solubility characteristics in exposed and unexposed areas of the resist coating layer. See also R. D. Allen et al. *Proceedings of SPIE*, 2724:334–343 (1996); and P. Trefonas et al. *Proceedings of the 11th International Conference on Photopolymers* (*Soc. of Plastics Engineers*), pp 44–58 (Oct. 6, 1997).

While currently available photoresists are suitable for many applications, current resists can also exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 248 nm (provided by a KrF laser), 193 nm (provided by an ArF exposure tool) or 157 nm. Use of such short exposure wavelengths can enable formation of smaller features. Accordingly, a photoresist that yields well-resolved images upon 248, 193 or 157 nm exposure could enable formation of extremely small (e.g. sub-quarter micron) features that respond to constant industry demands for smaller dimension circuit patterns, e.g. to provide greater circuit density and enhanced device performance.

Current photoresist compositions include one or more polymeric binders, optionally a cross-linking agent and a photoactive component. The polymeric binders are typically linear polymers having relatively low molecular weights, such as up to 20,000 Daltons. Such polymeric binders are desired as they tend to form coatings of uniform thickness and can be easily dispensed onto a substrate for lithographic processing. When photoresists containing such linear polymers are used in nanolithographic (i.e. under 200 nm) processes, line edge roughness is often difficult to control. When conventional photoresists containing acrylate-based polymeric binders are used, the resulting exposed resist cannot be developed using conventional tetraalkylammonium hydroxide based developers, but instead require very dilute tetraalkylammonium hydroxide based developers or other developers such as carbonate. Such developers tend to swell acrylate-based polymers, which adversely affects the imaged feature size, adhesion to the substrate, linewidth, line development and collapse of the feature.

Other forms of polymeric binders, such as polymer particles, have not been used as binders in photoresist compositions. Such polymer particles have been thought difficult to dispense to provide a uniform coating on a substrate, difficult to image and highly prone to defects.

Thus, there is a continuing need for photoresists, particularly for nanolithographic processes, that have reduced or controllable line edge roughness.

SUMMARY OF THE INVENTION

It has been surprisingly found that polymeric particles are effective as binders in photoresist compositions. It has also been surprisingly found that certain polymeric, particle binders, such as fluorinated polymeric particles, are particularly effective for use in photoresist compositions for imaging at sub-200 nm wavelengths, such as 157 nm.

In one aspect, the present invention provides a photoresist composition including a plurality of cross-linked polymeric particles and a photoactive component, wherein the polymeric particles include one or more cleavable groups and wherein the composition is substantially free of surfactant.

In a second aspect, the present invention provides a method for forming a photoresist relief image, including the steps of applying a coating layer of a photoresist composition including a plurality of cross-linked polymeric particles and a photo active component, wherein the polymeric particles include one or more cleavable groups and wherein the photoresist composition is substantially free of a surfactant; exposing the photoresist coating layer to patterned activating radiation; and developing the exposed photoresist coating layer to provide a photoresist relief image.

In a third aspect, the present invention provides a plurality of core-shell polymeric particle comprising one or more photoactive components as core-material.

In a fourth aspect, the present invention provides a photoresist composition including a plurality of core-shell polymeric particles and a photo active component, wherein the polymeric particles include one or more cleavable groups.

In a fifth aspect, the present invention provides a method for forming a photoresist relief image, including the steps of applying a coating layer of a photoresist composition including a plurality of core-shell polymeric particles and a photoactive component, wherein the polymeric particles include one or more cleavable groups; exposing the photoresist coating layer to patterned activating radiation; and developing the exposed photoresist coating layer to provide a photoresist relief image.

In a sixth aspect, the present invention provides a photoresist composition including a plurality of cross-linked polymeric particles and a photoactive component, wherein the polymeric particles include one or more cleavable groups and wherein the composition is substantially free of solvent.

In a seventh aspect, the present invention provides a method for manufacturing an electronic device including the steps of disposing on the surface of a substrate a photoresist composition including a plurality of cross-linked polymeric particles and a photoactive component, wherein the polymeric particles include one or more cleavable groups and wherein the photoresist composition is substantially free of surfactant; exposing the photoresist coating layer to patterned activating radiation; and developing the exposed photoresist coating layer to provide a photoresist relief image.

In an eighth aspect, the present invention provides a method for manufacturing an electronic device including the steps of disposing on the surface of a substrate a photoresist composition including a plurality of core-shell polymeric particles and a photoactive component wherein the polymeric particles include one or more cleavable groups; exposing the photoresist coating layer to patterned activating radiation; and developing the exposed photoresist coating layer to provide a photoresist relief image.

In a ninth aspect, the present invention provides a photoresist composition including a plurality of cross-linked solution polymer particles and a photoactive component, wherein the polymer particles include one or more cleavable groups.

DETAILED DESCRIPTION OF THE INVENTION

As used throughout this specification, the following abbreviations shall have the following meanings, unless the context clearly indicates otherwise: ° C.=degrees Centigrade; g=gram; w/w=weight per weight basis; Å=angstrom; nm=nanometer; t-BMA=tert-butyl methacrylate; MMA= methyl methacrylate; EMA=ethyl methacrylate; TMPTMA=trimethylolpropane trimethacrylate; 3-FSTY=3-fluorostyrene; 4-FSTY=4-fluorostyrene; OFPA= octafluoropentyl acrylate; PFOEMA=perfluorooctylethyl methacrylate; TFEA=trifluoroethyl acrylate; TFEMA= trifluoroethyl methacrylate; TFE=tetrafluoroethylene, TFPA=tetrafluoropropyl acrylate; HO-STY= hydroxystyrene; HFBVE=heptafluorobutanol vinyl ether; TFM-HO-STY=trifluoromethyl-hydroxystyrene and t-boc= tert-butoxycarbonyl.

The terms "resin" and "polymer" are used interchangeably throughout this specification. The term "alkyl" refers to linear, branched and cyclic alkyl. The terms "halogen" and "halo" include fluorine, chlorine, bromine, and iodine. Thus the term "halogenated" refers to fluorinated, chlorinated, brominated, and iodinated. "Fluoroalkyl" refers to both partially fluorinated and perfluorinated alkyl. "Polymers" refer to both homopolymers and copolymers and include dimers, trimers, oligomers and the like. The term "(meth) acrylate" refers to both acrylate and methacrylate. Likewise, the term "(meth)acrylic" refers to both acrylic and methacrylic. "Monomer" refers to any ethylenically or acetylenically unsaturated compound capable of being polymerized. The terms "cross-linker" and "cross-linking agent" are used interchangeably throughout this specification.

All amounts are percent by weight and all ratios are by weight, unless otherwise noted. All numerical ranges are inclusive and combinable.

Figure 1:
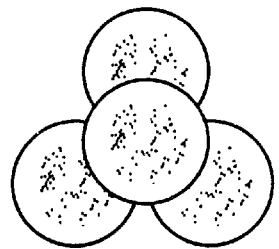
FIG. 1 illustrates a variety of polymer particle morphologies and structures useful in the present invention.
Figure 1:
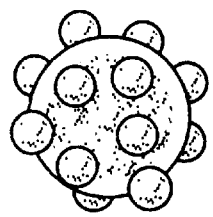
Figure 1:
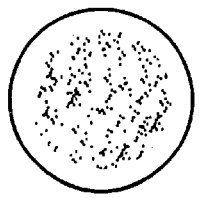
Figure 1:
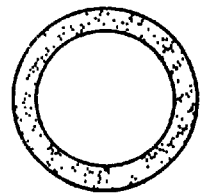
Figure 1:
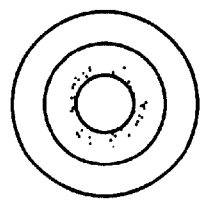
Figure 1:
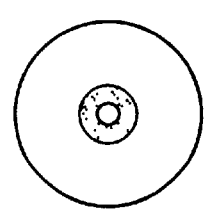

The photoresist compositions of the present invention include a plurality of cross-linked polymeric particles and a photoactive component, wherein the composition is substantially free of a surfactant. The photoresist compositions of the present invention also include a plurality of core-shell polymeric particles and a photoactive component. The present photoresist compositions further include a plurality of polymeric particles and a photoactive component wherein the composition is substantially free of solvent. "Polymer particles" or "polymeric particles" are well known to those skilled in the art and refer to a wide variety of hyperbranched polymeric materials, such as, but not limited to, particles, nanoparticles, nanogels, core-shell particles, and the like. The polymeric particles may have a variety of morphologies, including single-lobed such as spherical, substantially spherical, cigar-shaped, rod-shaped and moon-shaped, and multilobed such as tetrahedral, raspberry, acorn, dumb-bell and the like. The particles useful in the present invention may also have a variety of structures such as uniform or core-shell such as egg-shell, egg-white and egg-yolk. FIG. 1 illustrates a variety of possible polymer particle morphologies and structures. It is preferred that the particles are single-lobed. As used herein, "polymer particles" do not include linear polymers or dendrimer polymers.

The photoresist compositions of the present invention may be negative- or positive-acting, and preferably positive-acting. Such compositions may also be liquid or dry-film photoresists. Particularly useful photoresist compositions are liquid.

A wide variety of polymeric particles may be used in the present invention. Such polymeric particles may be homopolymers or copolymers, and preferably are copolymers. Thus, the polymeric particles contain, as polymerized units, one or more monomers including a cleavable group or leaving group, i.e. a group that is cleaved when contacted with the species generated by photolysis of the photoactive component. For example, when the photoactive component is a photoacid generator, the monomer includes an acid sensitive or acid cleavable group, which is cleaved by contact with the photogenerated acid leaving a base soluble moiety. In such monomers, the acid sensitive or acid cleavable group is typically attached to a phenolic hydroxyl group or a carboxyl group. Suitable acid sensitive or acid cleavable groups attached to a carboxylate include, but are not limited to alkyl groups having 4 or more carbon atoms with at least one quaternary carbon atom bonded directly to a carboxylate oxygen such as tert-butyl esters, 2,3-dimethylbutyl esters, 2-methylpentyl esters, 2,3,4-trimethylpentyl esters, alicyclic esters, acetals or ketals from vinyl ethers or enols such as —O—(CH(CH$_3$)OC$_2$H$_5$) or —O—(CH$_2$OC$_2$H$_5$), tetrahydropyran ("THP"). Suitable alicyclic esters as leaving groups include adamantyl, methyladamantyl, ethyladamantyl, methylnorbornyl, ethylnorbornyl, ethyltrimethylnorbornyl, ethyl fenchol and the like. Suitable acid cleavable groups attached to a phenolic hydroxyl group include, but are not limited to acetals, ketals, THP and tert-butoxyxcarbonyl. Likewise, when the photoactive component is a photobase generator, the monomer includes a base sensitive or base cleavable group such as 9-fluorenylmethanol esters. Particularly suitable monomers include tert-butyl (meth)acrylate.

It will be appreciated by those skilled in the art that one or more ethylenically unsaturated monomers, acetylenically unsaturated monomers or mixtures thereof may be copolymerized with the one or more monomers including cleavable groups. Such ethylenically or acetylenically unsaturated monomers or mixtures thereof may be present in the polymers of the present invention in an amount in the range of 1 to 99 percent by weight, based on the total weight of the monomers, preferably from 10 to 95 percent by weight, more preferably from 20 to 90 percent by weight, and even more preferably from 60 to 90 percent by weight. It is further preferred that the polymeric particles are crosslinked. Preferred polymeric particles contain as polymerized units, one or more monomers including a cleavable group, one or more additional monomers and one or more cross-linking agents.

The one or more additional ethylenically or acetylenically unsaturated monomers that may be copolymerized used in the present invention include, but are not limited to: (meth) acrylic acid, (meth)acrylamides, alkyl (meth)acrylates, alkenyl (meth)acrylates, aromatic (meth)acrylates, vinyl aromatic monomers, nitrogen-containing compounds and their thio-analogs, substituted ethylene monomers, cyclic olefins, substituted cyclic olefins, and the like.

Typically, the alkyl (meth)acrylates useful in the present invention are (C$_1$–C$_{24}$)alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched (C$_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate, ("DPMA"), a mixture of linear and branched isomers of dodecyl, tridecyl, tetradecyl and pentadecyl methacrylates; and lauryl-myristyl methacrylate ("LMA").

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy (C$_2$–C$_6$)alkyl (meth)acrylates, dialkylamino (C$_2$–C$_6$)-alkyl (meth)acrylates, dialkylamino(C$_2$–C$_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a (C$_2$–C$_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or HPMA.

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(, 1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri ($C_1$–$C_6$)alkylsilyl (meth)acrylate, γ-propyl di($C_1$–$C_6$)alkoxy ($C_1$–$C_6$)alkylsilyl (meth)acrylate, γ-propyl di($C_1$–$C_6$)alkyl ($C_1$–$C_6$)alkoxysilyl (meth)acrylate, vinyl tri($C_1$–$C_6$) alkoxysilyl (meth)acrylate, vinyl di($C_1$–$C_6$)alkoxy($C_1$–$C_6$) alkylsilyl (meth)acrylate, vinyl ($C_1$–$C_6$)alkoxydi($C_1$–$C_6$) alkylsilyl (meth)acrylate, vinyl tri($C_1$–$C_6$)alkylsilyl (meth) acrylate, 2-propylsilsesquioxane (meth)acrylate and mixtures thereof.

The vinyl aromatic monomers useful as unsaturated monomers in the present invention include, but are not limited to: styrene ("STY"), hydroxystyrene, α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$–$C_{10}$)alkoxy, halo($C_1$–$C_{10}$)alkyl, carb($C_1$–$C_{10}$) alkoxy, carboxy, amino, ($C_1$–$C_{10}$)alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl ($C_1$–$C_8$) substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride, vinylidene bromide, tetrafluoroethylene, trifluoroethylene, trifluoromethyl vinyl acetate, vinyl ethers and itaconic anhydride.

Suitable cyclic olefin monomers useful in the present invention are ($C_5$–$C_{10}$)cyclic olefins, such as cyclopentene, cyclopentadiene, dicylopentene, cyclohexene, cyclohexadiene, cycloheptene, cycloheptadiene, cyclooctene, cyclooctadiene, norbornene, maleic anhydride and the like. Such cyclic olefins also include spirocyclic olefin monomers such as spirocyclic norbornenyl monomers, spirocyclic cyclohexene monomers, spirocyclic cyclopentene monomers and mixtures thereof. Suitable substituted cyclic olefin monomers include, but are not limited to, cyclic olefins having one or more substituent groups selected from hydroxy, aryloxy, halo, ($C_1$–$C_{12}$)alkyl, ($C_1$–$C_{12}$)haloalkyl, ($C_1$–$C_{12}$)hydroxyalkyl, ($C_1$–$C_{12}$) halohydroxyalkyl such as $(CH_2)_{n'}(CF_3)_2OH$ where n'=0 to 4, ($C_1$–$C_{12}$)alkoxy, thio, amino, ($C_1$–$C_6$)alkylamino, ($C_1$–$C_6$) dialkylamino, ($C_1$–$C_{12}$)alkylthio, carbo($C_1$–$C_{20}$)alkoxy, carbo($C_1$–$C_{20}$)haloalkoxy, ($C_1$–$C_{12}$)acyl, ($C_1$–$C_6$) alkylcarbonyl($C_1$–$C_6$)alkyl, and the like. Particularly suitable substituted cyclic olefins include maleic anhydride and cyclic olefins containing one or more of hydroxy, aryloxy, ($C_1$–$C_{12}$)alkyl, ($C_1$–$C_{12}$)haloalkyl, ($C_1$–$C_{12}$)hydroxyalkyl, ($C_1$–$C_{12}$)halohydroxyalkyl, carbo($C_1$–$C_{20}$)alkoxy, and carbo($C_1$–$C_{20}$)haloalkoxy. It will be appreciated by those skilled in the art that the alkyl and alkoxy substituents may be optionally substituted, such as with halogen, hydroxyl, cyano, ($C_1$–$C_6$)alkoxyl, mercapto, ($C_1$–$C_6$)alkylthio, amino, acid labile leaving group and the like. Suitable carbo ($C_1$–$C_{20}$)alkoxy substituents include, but are not limited to, those of the formula C(O)O—LG, wherein LG is a leaving group including, but not limited to, alkyl groups having 4 or more carbon atoms with at least one quaternary carbon atom bonded directly to a carboxylate oxygen such as tert-butyl esters, 2,3-dimethylbutyl esters, 2-methylpentyl esters, 2,3,4-trimethylpentyl esters, alicyclic esters, acetals or ketals from vinyl ethers or enols such as —O—(CH(CH$_3$) OC$_2$H$_5$) or —O—(CH$_2$OC$_2$H$_5$), tetrahydropyran ("THP"). Suitable alicyclic esters as leaving groups include adamantyl, methyladamantyl, ethyladamantyl, methylnorbornyl, ethylnorbornyl, ethyltrimethylnorbornyl, ethyl fenchol and the like.

The polymeric particles of the present invention are typically cross-linked. Any amount of cross-linker is suitable for use in the present invention. Typically, the particles of the present invention contain at least 1% by weight, based on the total weight of the polymer, of cross-linker. Up to and including 100% cross-linking agent, based on the total weight of the polymer, may be effectively used in the particles of the present invention. It is preferred that the amount of cross-linker is from about 1% to about 80%, and more preferably from about 1% to about 60%.

Suitable cross-linkers useful in the present invention include di-, tri-, tetra-, or higher multi-functional ethylenically unsaturated monomers. Examples of cross-linkers useful in the present invention include, but are not limited to: trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly (phenyl vinyl siloxane) and mixtures thereof. Particularly suitable cross-linking agents are those having the formula

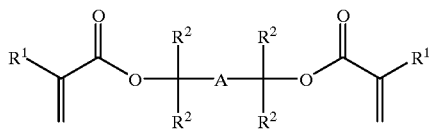

wherein $R^1$ and $R^2$ are independently hydrogen, methyl or ethyl, and A is a linking group. Any linking group is suitable for A, such as $(C_1-C_{20})$alkyl, $(C_1-C_{20})$haloalkyl and preferably $(C_1-C_{20})$perfluoroalkyl or $(C_1-C_{20})$fluoroalkyl, oxygen, $(C_2H_4O)_n$, $(C_3H_6O)_m$, $NR^2$, phenyl substituted phenyl, $(CH_2)_p$—O—$(C_4F_6)$—O—$(CH_2)_{p'}$ and the like, wherein n=1–100, m=1–100, p=0–10, p'=0–10 and $R^2$= $(C_1-C_{12})$alkyl, phenyl and the like. Other suitable cross-linking agents include those having the formula

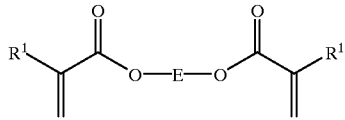

wherein $R^1$ is as defined above and E is selected from haloarylene, halo$(C_1-C_6)$alkylarylene, halodi$(C_1-C_6)$alkylarylene, polyarylene, polyaryleneethers, polyarylenesilanes and the like. Particularly, E may be —$C_6H_2(CF_3)_2$-, —Ph—$SiR_2$—Ph—O—$(C_4F_6)$—O—Ph—$SiR_2$—Ph—, and —Ph—$C(CF_3)_2$—Ph—O—$(C_4F_6)$—O—Ph—C $(CF_3)_2$—Ph, wherein R=$(C_1-C_6)$alkyl or phenyl. "Ph" refers to phenylene.

When it is desired to image the polymeric particles of the present invention at sub-200 nm, such as 157 nm, it is preferred that the polymeric particles contain, as polymerized units, one or more fluorinated monomers, one or more fluorinated cross-linkers or a mixture thereof. Preferably, the fluorinated monomers or cross-linkers are highly fluorinated. Any monomer containing a fluoroalkyl group, such as trifluoromethyl, is particularly suitable. Suitable fluorinated monomers include, but are not limited to fluorinated (meth) acrylates and (meth)acrylamides such as fluoroalkyl (meth) acrylate such as fluoro$(C_1-C_{20})$alkyl (meth)acrylate, fluorocycloalkyl (meth)acrylate, fluoroalkylsulfoamidoethyl (meth)acrylate, fluoroalkylamidoethyl (meth)acrylate, fluoroalkyl (meth)acrylamide, fluoroalkylpropyl (meth)acrylate, fluoroalkylethyl poly(alkyleneoxide) (meth)acrylate, fluoroalkylsulfoethyl (meth)acrylate, αH,αH,ωH,ωH-perfluoroalkanediol di(meth)acrylate and β-substituted fluoroalkyl (meth)acrylate; fluorinated vinyl ethers such as fluoroalkylethyl vinyl ether and fluoroalkylethyl poly (ethyleneoxide) vinyl ether; fluorinatedalcohol vinyl ethers; fluorinated vinyl acetates; fluorinatedalkyl vinyl acetates such as trifluoromethyl vinyl acetate; fluorinated aromatics such as fluorostyrene, pentafluoro styrene and fluoroalkyl styrene; fluorinated hydroxyaromatics such as fluorinated hydroxystyrene; fluorinated ethylene such as vinylidene fluoride, trifluoroethylene and tetrafluoroethylene; fluorinated α-olefins; fluorinated dienes such as perfluorobutadiene and 1-fluoroalkylperfluorobutadiene, fluorinated heterocycles such as perfluoro-(2,2-dimethyl-1,3-dioxole) and perfluoro-(2-methylene-4-methyl-1,3-dioxolane). Preferred fluorionated monomers include 3-fluorostyrene, 4-fluorosytrene, perfluorooctylethyl (meth)acrylate, perfluorooctylethyl (meth)acrylate, octafluoropentyl (meth) acrylate, trifluoroethyl (meth)acrylate, tetrafluoropropyl (meth)acrylate, vinylidene fluoride, trifluoroethylene, tetrafluoroethylene, perfluoro-(2,2-dimethyl-1,3-dioxole) and perfluoro-(2-methylene-4-methyl-1,3-dioxolane).

It will be appreciated that oligomers may be used in preparing the present polymeric particles. Thus, for imaging at sub-200 nm wavelength radiation, fluorinated oligomers may suitable be employed. Suitable fluorinated oligomers are disclosed in published PCT patent application WO 00/17712. Suitable oligomers include those prepared from the following monomer combinations: TFE/norbornene, TFE/nonbornene carboxylic acid, TFE/norbonene/nonbornene carboxylic acid, TFE/nonbornene/acrylic acid, TFE/nonbornene/ethylene, TFE/nonbornene/methacrylic acid, TFE/nonbornene/tert-butyl acrylate, TFE/nonbornene/tert-butyl acrylate/acrylic acid, TFE/nonbornene/tert-butyl acrylate/methacrylic acid, TFE/nonbornene/vinyl acetate, TFE/nonbornene/vinyl alcohol, TFE/nonbornene/5-norbornene-2-carboxylic acid tert-butyl ester, TFE/1-adamantane-carboxylate vinyl ester, TFE/adamantanemethylvinyl ether and TFE/norbornanemethylvinyl ether.

The polymeric particles useful in the present invention may be prepared by any of a variety of methods, such as solution polymerization, emulsion polymerization, dispersion polymerization and the like. For example, the nanoparticles or nanogel particles are typically prepared by solution polymerization. The core-shell polymer particles are typically prepared by emulsion or dispersion polymerization. It is preferred that the polymers of the present invention are prepared using anionic polymerization or free radical polymerization techniques. It is also preferred that the polymers useful in the present invention are not prepared by step-growth polymerization processes.

Polymeric particles, such as nanoparticles and nanogel particles, prepared by solution polymerization are generally prepared by first charging a solvent heel or alternatively a mixture of solvent and some portion of the monomer mixture to a reaction vessel equipped with a stirrer, a thermometer and a reflux condenser. The monomer mixture is typically composed of monomer, initiator and chain transfer agent, as appropriate. The solvent or solvent/monomer mixture heel is heated with stirring under a nitrogen blanket to a temperature from about 55° C. to about 125° C. After the heel charge has reached a temperature sufficient to initiate polymerization, the monomer mixture or balance of the monomer mixture is charged to the reaction vessel over a period of 15 minutes to 4 hours while maintaining the reaction at the desired reaction temperature. After completing the monomer mixture addition, a series of additional aliquots of initiator in solvent are charged to the reaction. Typically, the initiator is charged to the reaction and followed by a hold period to allow for reaction to occur before adding the next initiator amount. Typically three initiator additions are used. After the final initiator amount is added the batch is held for 30 minutes to 4 hours to fully decompose all initiator and drive the reaction to completeness. An alternative method is to first charge both solvent and a portion of the monomer mixture to the reaction vessel.

Polymeric particles prepared by emulsion polymerization are generally prepared by first charging water and some portion of the monomer emulsion to a reaction vessel equipped with a stirrer, a thermometer and a reflux condenser. Typically, the monomer emulsion is composed of monomer, surfactant, initiator and chain transfer agent, as appropriate. The initial charge of monomer emulsion is heated with stirring under a nitrogen blanket to a temperature of from about 55° C. to about 125° C. After the seed charge has reached a temperature sufficient to initiate polymerization, the monomer emulsion or balance of the monomer emulsion is charged to the reaction vessel over a period of 15 minutes to 4 hours while maintaining the reaction at the desired reaction temperature. After completing the monomer emulsion addition, a series of additional aliquots of initiator in water are charged to the reaction. Typically the initiator is charged to the reaction and followed by a hold period to allow for reaction to occur before adding the next initiator amount. Typically three initiator additions are used. After the final initiator amount is added, the batch is held for 30 minutes to 4 hours to fully decompose all initiator and drive the reaction to completeness.

In the alternative, the emulsion polymerization may be carried out in a batch process. In such a batch process, the emulsion polymers are prepared by charging water, monomer, surfactant, initiator and chain transfer agent, as appropriate, to a reaction vessel with stirring under a nitrogen blanket. The monomer emulsion is heated to a temperature of from about 55° C. to about 125° C. to carry out the polymerization. After 30 minutes to 4 hours at this temperature, a series of additional aliquots of initiator are charged to the reaction vessel. Typically the initiator is charged to the reaction vessel followed by a hold period to allow for reaction to occur before adding the next amount of initiator. Typically three initiator additions are used. After the final initiator amount is added, the batch is held for 30 minutes to 4 hours to fully decompose all initiator and drive the reaction to completeness.

Core-shell polymeric particles are particles have a core material surrounded by one or more discrete polymer shells. "Discrete" is understood to mean separate and distinct. "Core material" includes a single material or a mixture of materials. The term "shell" refers to a discrete layer completely encasing the core material and generally immiscible in the core material. Such core-shell particles are typically prepared by (a) providing a first emulsion comprising a core material in an aqueous phase, a second emulsion comprising polymer seed particles, one or more monomers and optionally one or more cross-linking agents; (b) combining the first emulsion, the second emulsion, one or more monomers and optionally one or more cross-linking agents; (c) forming discrete domains in the aqueous phase, wherein the domains include the core material, one or more monomers and optionally one or more cross-linking agents; (d) polymerizing the one or more monomers and optional cross-linking agents to form a plurality of polymer particles, each particle including a discrete polymer shell encasing the core material. Multiple shells may be provided by swelling the particle from step (d) with one or more additional monomers and polymerizing the additional monomers. It will be appreciated by those skilled in the art that the one or more monomers or the one or more cross-linking agents in step (a) may be added to the first emulsion, the second emulsion, to both emulsions, or to the combined first and second emulsions.

In such core-shell particles, a wide variety of materials may be used as the core material. Suitable core materials include, but are not limited to, photoactive components such as photoacid generators, dyes, base, solvent, and the like. It will also be appreciated that the core material, such as a solvent, may be removed from the particle, to provide a hollow-sphere particle.

Particularly useful pluralities of polymeric particles include, but are not limited to, those including the photoactive component within the polymeric particle. Thus, the present invention includes a plurality of core-shell polymer particles wherein the core material is one or more photoactive components.

The particles of the present invention may be surface modified, such as by reacting the particles with one or more other components. Such surface modification may be advantageous in certain systems where surfactant functionality, cross-linkable functionality or other functionality on the polymer surface is desired.

The particles of the present invention may be isolated, typically in powder form but may also be gels or solutions. Such isolated particles are typically substantially free of solvents, such as organic solvents and water. Such isolated particles may be further combined with a photoactive component. Compositions including such isolated particles and photoresist may be combined with or taken up in any of a variety of solvents such as organic solvents and water, or may be used as is. If the particles are to be taken up in water, it may be desirable to use a surfactant or wetting agent and/or surface modify the particles to provide water solubility or dispersability.

When the isolated particles are solution polymerized nanoparticles or nanogel particles containing appropriate surface functionality, such as one or more of hydroxyl, amino, alkoxy, carboxyl and the like, they may be taken up in water without the use of, or with the use of very low amounts of surfactant. The resulting compositions include a plurality of polymer particles in water, that are substantially free of surfactant. Such compositions are also substantially free of organic solvents. Photoresist compositions containing such polymer particles thus include a plurality of polymer particles including one or more cleavable groups and a photoactive component, wherein the compositions are substantially free of surfactant. Such photoresist compositions are preferably substantially free of organic solvent.

When the isolated particles are taken up in an organic solvent, it will be appreciated by those skilled in the art that one or more surfactants may also be used to improve flowability, wettability and the like. Thus, the present invention also includes photoresist compositions including one or more organic solvents, a plurality of polymer particles including one or more cleavable groups, a photoactive component and optionally one or more surfactants. Suitable surfactants include anionic, cationic, nonionic and amphoteric surfactants.

One of the advantages of the present photoresist compositions is that the size of the polymer particles can be carefully tailored. Suitable polymer particles are those having a mean particle size up to about 1000 nm, such as in the range of about 1 to about 1000 nm. It is preferred that the mean particle size is in the range of about 1 to about 200 nm, more preferably from about 1 about 50 nm, still more preferably from about 1 nm to about 20 nm, and most preferably from about 1 to about 10 nm. Solution polymer particles typically have a weight average molecular weight in the range of 10,000 to 1,000,000, preferably in the range of 20,000 to 500,000 and more preferably in the range of 20,000 to 100,000. The polydispersity of these solution polymers is in the range 1 to 20 and more preferably in the range of 1.001 to 15 and most preferably in the range of 1.001 to 10. The emulsion polymer particles typically have a weight average molecular weight in the range of 1000 to 10,000,000, preferably 100,000 to 5,000,000, and more preferably 100,000 to 1,000,000. The polydispersity of these emulsion polymer particles is in the range 1.0001 to 10, more preferably 1.001 to 5, and most preferably 1.001 to 2.5. Polydispersities of about 1.3 to 1.0 can be achieved for core-shell particles. The term "polydispersity" is known in the art as an indicator of the breadth of domain size (or particle size) distribution. Polydispersity as used herein is calculated by dividing the weight average size by the number average size. A polydispersity of one (1) refers to particles that are monodisperse.

The photoactive components useful in the present invention are typically photoacid or photobase generators, and preferably photoacid generators. More than one photoactive component may be advantageously used in the present invention.

The photoacid generators useful in the present invention are any compounds which liberate acid upon exposure to light, typically at a wavelength of about 320 to 420 nanometers, however other wavelengths may be suitable. Suitable photoacid generators include halogenated triazines, onium salts, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines and the like.

Particularly useful halogenated triazines include halomethyl-s-triazines. Suitable halogenated triazines include for example, 2-[1-(3,4-benzodioxolyl)]-4,6-bis(trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)-1,3,5-triazine, 2-(2-furfylethylidene)-4,6-bis(trichloromethyl)-1,3,5-triazine, 2-[2-(5-methylfuryl)ethylidene]-4,6-bis(trichloromethyl)-1,3,5-triazine, 2-[2-(4-methylfuryl)ethylidene]4,6-bis(trichloromethyl)-1,3,5-triazine, 2-[2-(3-methylfuryl)ethylidene]-4,6-bis-(trichloromethyl)-1,3,5-triazine, 2-[2-(4,5-dimethylfuryl)ethylidene]-4,6-bis(trichloromethyl)-1,3,5-triazine, 2-[2-(5-methoxyfuryl)ethylidene]-4,6-bis(trichloromethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis(trichloromethyl)-1,3,5-triazine, 2-[2-(4,5-dimethoxy-furyl)ethylidene]-4,6-bis(trichloromethyl)-1,3,5-triazine, 2-(2-furfylethylidene)-4,6-bis(tribromomethyl)-1,3,5-triazine, 2-[2-(5-methylfuryl)ethylidene]-4,6-bis(tribromomethyl)-1,3,5-triazine, 2-[2-(4-methylfuryl)-ethylidene]-4,6-bis(tribromomethyl)-1,3,5-triazine, 2-[2-(3-methylfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2-[2-(5-methoxyfuryl)ethylidene]-4,6-bis(tribromomethyl)-1,3,5-triazine, 2-[2-(4-methoxyfuryl)ethylidene]-4,6-bis(tribromomethyl)-1,3,5-triazine, 2-[2-(3-methoxyfuryl)ethylidene]-4,6-bis(tribromomethyl)-1,3,5-triazine, 2-[2-(4,5-dimethoxyfuryl)ethylidene]4,6-bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan,* 42, 2924–30 (1969).

Onium salts with weakly nucleophilic anions are suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts such as iodonium salts, quaternary ammonium, phosphonium and arsonium salts, aromatic sulfonium salts and sulfoxonium salts or selenium salts. Examples of suitable onium salts are disclosed in U.S. Pat. Nos. 4,442,197; 4,603,101; and 4,624,912, all incorporated herein by reference.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology,* vol. 4, No. 3,337–340 (1991), incorporated herein by reference.

Suitable halogenated sulfonyloxy dicarboximides useful as photoacid generators in the present invention include, but are not limited to: 1(((trifluoromethyl)sulfonyl)oxy)-1H-pyrrole-2,5-dione; N-((perfluorooctanesulfonyl)oxy)-5-norbornene-2,3-dicarboximide; 1-(((trifluoromethyl)sulfonyl)oxy)-2,5-pyrrolidinedione; 3a,4,7,7a-tetrahydro-2-(((trifluoromethyl)sulfonyl)oxy)-4,7-methano-1 H-isoindole-1,3(2H)-dione; 2-(((trifluoromethyl)sulfonyl)oxy)-1H-benz(f)isoindole-1,3(2H)-dione; 3,4-dimethyl-1-(((trifluoromethyl)sulfonyl)oxy)-1H-pyrrole-2,5-dione; 2-(((trifluoromethyl)sulfonyl)oxy)-1H-isoindole-1,3(2H)-dione; 2-(((trifluoromethyl)sulfonyl)oxy)-1H-benz(de)isoquinoline-1,3(2H)-dione; 4,5,6,7-tetrahydro-2-(((trifluoromethyl)sulfonyl)oxy)-1H-isoindole-1,3(2H)-dione; 3a,4,7,7a-tetrahydro-2-(((trifluoromethyl)sulfonyl)oxy)-4,7-epoxy-1H-isoindole-1,3(2H)-dione; 2,6-bis- (((trifluoromethyl)sulfonyl)oxy)-benzo(1,2-c:4,5-c')dipyrrole-1,3,5,7(2H,6H)-tetrone; hexahydro-2,6-bis-(((trifluoromethyl)sulfonyl)oxy)-4,9-methano-1H-pyrrolo(4,4-g)isoquinoline-1,3,5,7(2H,3aH,6H)-tetrone; 1,8,8-trimethyl-3-(((trifluoromethyl)sulfonyl)oxy)-3-azabicyclo(3.2.1)octane-2,4-dione; 4,7-dihydro-2—(((trifluoromethyl)sulfonyl)oxy)-4,7-epoxy-1H-isoindole-1,3(2H)-dione; 3-(1-naphthalenyl)-4-phenyl-1—(((trifluoromethyl)sulfonyl)oxy)-1H-pyrrole-2,5-dione; 3,4-diphenyl-1—(((trifluoromethyl)sulfonyl)oxy)-1H-pyrrole-2,5-dione; 5,5'-(2,2,2-trifluoro-1-(triflluoromethyl)ethylidene)bis(2-(((trifluoromethyl)sulfonyl)oxy)-1H-isoindole-1,3(2H)-dione; tetrahydro-4-(((trifluoromethyl)sulfonyl)oxy)-2,6-methano-2H-oxireno(f)isoindole-3,5(1aH,4H)-dione; 5,5'-oxybis-2-(((trifluoromethyl)sulfonyl)oxy)-1H-isoindole-1,3(2H)-dione; 4-methyl-2-(((trifluoromethyl)sulfonyl)oxy)-1H-isoindole-1,3(2H)-dione; 3,3,4,4-tetramethyl-1-(((trifluoromethyl)sulfonyl)oxy)-2,5-pyrrolidinedione and mixtures thereof. It is preferred that the halogenated sulfonyloxy dicarboxirnides comprise one or more of 1 (((trifluoromethyl)sulfonyl)oxy)-1H-pyrrole-2,5-dione; N-((perfluorooctanesulfonyl)oxy)-5-norbornene-2,3-dicarboximide; and 1-(((trifluoromethyl)sulfonyl)oxy)-2,5-pyrrolidinedione, and more preferably N-((perfluorooctanesulfonyl)oxy)-5-norbornene-2,3-dicarboximide.

Suitable diazodisulfones include those of the formula $R^1-SO_2-C(=N_2)-SO_2-R^2$, wherein R1 and R2 are independently selected from a monovalent cyclic group substituted on the cyclic nucleus by an acid-dissociable group such as tert-butoxycarbonyl and acetal groups, or phenyl or substituted phenyl. Suitable $R^1$ and $R^2$ groups include tert-butoxycarbonyl phenyl, (2-tetrahydropyranyl)oxy phenyl, (2-tetrahydropyranyl)oxycarbonyl phenyl, tert-butoxycarbonylmethyloxy phenyl, (2-tetrahydropyranyl)oxycyclohexyl, (2-tetrahydropyranyl)oxy-10-bornyl, (1-ethoxyethoxy)cyclohexyl and (1-ethoxyethoxy)-10-bornyl. Certain diazomethanesulfones are disclosed in U.S. Pat. No. 5,945,517.

The photoactive components are typically added to photoresist compositions in an amount sufficient to generate a latent image in a coating layer of resist material upon exposure to activating radiation. When the photoactive component is a photoacid generator, the amount is typically in the range of 0.1 to 15 percent by weight, based on the weight of the resin, and preferably 1 to 10 percent by weight. It will be appreciated by those skilled in that art that more than one photoacid generators may be used advantageously in the photoresist compositions of the present invention.

It will be appreciated by those skilled in the art that the photoactive component may be used as the core material in a core-shell polymer particle. In such cases, the photoactive component is contained within the core-shell polymeric particle binder. Thus, a dual function one-component system may be used as a photoresist. Optionally, photoresist compositions including such core-shell particles may further contain one or more additional photoactive components, preferably photoacid generators.

In an alternative embodiment, a base may be used as the core material in a core-shell polymer.

Optional additives that may be used in the photoresist compositions of the present invention include, but are not limited to: anti-striation agents, plasticizers, speed enhancers, fillers, dyes, film forming agents, cross-linking agents and the like. Such optional additives will be present in relatively minor concentrations in a photoresist composition except for fillers and dyes which may be used in relatively large concentrations, e.g. in amounts of from about 5 to 30 percent by weight, based on the total weight of the composition's dry components.

In general, the polymer particles of the present invention have excellent film forming properties, and thus additional film forming agents are not required. For example, (meth) acrylate containing polymer particles, whether nanoparticles, nanogels or core-shell particles have good film forming properties and good adhesiveness to the substrate. However, such film forming agents may be advantageous in certain applications or with certain polymer particles.

The photoresist compositions of the present invention may be readily prepared by those skilled in the art. For example, a photoresist composition of the invention can be prepared by dissolving, suspending or dispersing the components of the photoresist in one or more suitable solvents. Such suitable solvents include, but are not limited to: ketone solvents such as acetone, methyl ethyl ketone, cyclohexanone, methyl isoamyl ketone and 2-heptanone; polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof; cyclic ether solvents such as dioxane; ester solvents such as methyl lactate, ethyl lactate, methyl acetate, ethyl acetate, butyl acetate, methyl pyruvate, ethyl pyruvate, methyl methoxypropionate and ethyl ethoxypropionate; and amide solvents such as N,N-dimethyl formamide, N,N-dimethyl acetamide, N-methyl-2-pyrrolidone, 3-ethoxyethyl propionate, 2-heptanone, γ-butyrolactone, and mixtures thereof.

In an alternate embodiment, substantially solvent free polymeric particles including one or more cleavable groups may be combined or blended with one or more photoactive components, and then dissolved, dispersed, suspended or otherwise combined with one or more solvents, including organic solvents and water.

Typically, the solids content of the photoresist composition varies from about 5 to about 35 percent by weight, based on the total weight of the composition. The resin binder and photoacid generators should be present in amounts sufficient to provide a film coating layer and formation of good quality latent and relief images.

Negative-working photoresists may also be prepared according to the present invention. The polymer particles useful in negative photoresist typically have exposed cross-linkable functionality, e.g. on the surface of the particle. Hydroxyl functionality is a particularly suitable cross-linkable functionality. Thus, for negative photoresists, it is preferred that the polymer particles include one or more monomers or cross-linking agents containing hydroxyl functionality, such as, but not limited to, hydroxyethyl methacrylate, hydroxyethyl acrylate, hydroxy-aromatics such as hydroxy-styrene, and the like. Such negative photoresist compositions typically include one or more photoactive components such as a photoacid generator, and a cross-linking agent. Suitable cross-linking agents include, but are not limited to, glycosyl ureas including di-, tri- and tetra-glycosyl ureas, and epoxies.

Such photoresist compositions may be applied to a substrate by any known means, such as spinning, dipping, roller coating and the like. When the compositions are applied by spin coating, the solids content of the coating solution can be adjusted to provide a desired film thickness based upon the specific spinning equipment utilized, the viscosity of the solution, the speed of the spinner and the amount of time allowed for spinning.

Photoresist compositions including the polymeric particles of the present invention are useful in all applications where photoresists are typically used. For example, the compositions may be applied over silicon wafers or silicon wafers coated with silicon dioxide for the production of microprocessors and other integrated circuit components. Aluminum-aluminum oxide, gallium arsenide, ceramic, quartz, copper, glass and the like are also suitably employed as substrates for the photoresist compositions of the invention.

Once the photoresist composition is coated on a substrate surface, it is dried by heating to remove any solvent. It is preferably dried until the coating is tack free. An advantage of the present invention is that the viscosity of the present photoresist compositions is lower than conventional photoresists providing more application process control and reduced defects during imaging. Also, films of the present photoresist compositions have greater film uniformity than those of conventional photoresists. Thus, the present invention provides a method for reducing defects during imaging by using the present photoresist compositions.

After the photoresist composition is dried, it is imaged through a mask in a conventional manner. The exposure is sufficient to effectively activate the photoactive component of the photoresist to produce a patterned image in the resist coating layer, and more specifically, the exposure energy typically ranges from about 1 to 100 mJ/cm$^2$, dependent upon the exposure tool and the specific components of the photoresist composition.

The photoresist compositions of the present invention are preferably activated by a short exposure wavelength, particularly a sub-300 nm, such as UV, and more preferably a sub-200 nm exposure wavelength. Particularly preferred wavelengths include 248, 193, 157 nm and 11–15 nm. However, the photoresist compositions of the present invention may also be used at higher wavelengths, such as, but not limited to, visible, e-beam and x-ray.

Following exposure, the film layer of the composition is preferably baked at temperatures ranging from about 70° C. to 160° C. Thereafter, the film is developed. The exposed resist film is rendered positive working by employing a polar developer, preferably an aqueous based developer, such as quaternary ammonium hydroxide solutions, such as tetraalkyl ammonium hydroxide, preferably a 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like. One skilled in the art will appreciate which development procedures should be used for a given system.

Unlike conventional (meth)acrylate based photoresist polymer binders which swell upon contact with tetramethylammonium hydroxide, the (meth)acrylate based polymer particles of the present invention do not substantially swell when contacted with tetramethylammonium hydroxide. An advantage of the present invention is that (meth)acrylate based polymeric binders that do not contain swell inhibiting monomers, such as itaconic anhydride or spirocycloolefins may be used. This allows the (meth)acrylate binders to be tailored more specifically for their lithographic properties.

After development of the photoresist coating, the developed substrate may be selectively processed on those areas bared of resist, for example, by chemically etching or plating substrate areas bared of resist in accordance with procedures known in the art. For the manufacture of microelectronic substrates, e.g. the manufacture of silicon dioxide wafers, suitable etchants include, but are not limited to, a gas etchant, such as a chlorine- or fluorine-based etchant, such as $Cl_2$ or $CF_4/CHF_3$ etchant applied as a plasma stream. After such processing, the resist may be removed from the processed substrate using any stripping procedures known in the art.

Thus, the present invention provides a method for forming a photoresist relief image, including the steps of applying a coating layer of a photoresist composition including a plurality of cross-linked polymeric particles and a photoactive component, wherein the polymeric particles include one or more cleavable groups and wherein the photoresist composition is substantially free of a surfactant; exposing the photoresist coating layer to patterned activating radiation; and developing the exposed photoresist coating layer to provide a photoresist relief image.

In an alternate embodiment, the present invention provides a method for forming a photoresist relief image, including the steps of applying a coating layer of a photoresist composition including a plurality of core-shell polymeric particles and a photoactive component, wherein the polymeric particles include one or more cleavable groups; exposing the photoresist coating layer to patterned activating radiation; and developing the exposed photoresist coating layer to provide a photoresist relief image.

The present invention also provides a method for manufacturing an electronic device including the steps of disposing on the surface of a substrate a photoresist composition including a plurality of cross-linked polymeric particles and a photoactive component, wherein the polymeric particles include one or more cleavable groups and wherein the photoresist composition is substantially free of surfactant; exposing the photoresist coating layer to patterned activating radiation; and developing the exposed photoresist coating layer to provide a photoresist relief image.

Alternatively, the present invention also provides a method for manufacturing an electronic device including the steps of disposing on the surface of a substrate a photoresist composition including a plurality of core-shell polymeric particles and a photoactive component, wherein the polymeric particles include one or more cleavable groups; exposing the photoresist coating layer to patterned activating radiation; and developing the exposed photoresist coating layer to provide a photoresist relief image.

The following examples are intended to illustrate further various aspects of the present invention, but are not intended to limit the scope of the invention in any aspect.

EXAMPLE 1

The following polymer particles are prepared by free radical solution polymerization in propylene glycol monomethyl ether acetate according to the procedure in U.S. Pat. No. 5,863,996 (Graham)

| Sample | Monomer Composition (w/w/w) |
|---|---|
| 1 | EMA/t-BMA/TMPTMA (50/40/10) |
| 2 | MMA/t-BMA/TMPTMA (50/40/10) |
| 3 | 3-FSTY/t-BMA/TMPTMA (50/40/10) |
| 4 | OFPA/t-BMA/TMPTMA (50/40/10) |
| 5 | 4-FSTY/t-BMA/TMPTMA (50/40/10) |
| 6 | PFOEMA/t-BMA/TMPTMA (50/40/10) |

-continued

| Sample | Monomer Composition (w/w/w) |
|---|---|
| 7 | TFEA/t-BMA/TMPTMA (50/40/10) |
| 8 | TFEMA/t-BMA/TMPTMA (50/40/10) |
| 9 | TFPA/t-BMA/TMPTMA (50/40/10) |
| 10 | HO-STY/STY/t-BMA/TMPTMA (30/20/40/10) |
| 11 | TFM-HO-STY/t-BMA/TMPTMA (50/40/10) |
| 12 | HO-STY/HFBVE/t-BMA/TMPTMA (20/30/40/10) |
| 13 | t-boc HO-STY/HFBVE/t-BMA/TMPTMA (22/25/45/8) |
| 14 | HO-STY/STY/TMPTMA (65/20/15) |
| 15 | HEMA/STY/ALMA (55/25/20) |

The polymer particles in the above table are all nanoparticles or nanogel particles and have a mean particle size of 1 to 50 nm.

EXAMPLE 2

A photoresist composition was prepared using Sample 2 from Example 1. Sample 2 (42 g. 15% in solution) was dissolved in propyleneglycol monomethyl ether acetate and ethyl lactate. Also combined with this were di-tertbutylphenyl iodonium perfluorooctanesulfonate as photoactive component (13 g), a base quencher (0.2 g) and 0.2 g of a nonionic surfactant. the total solids content was 11%.

EXAMPLE 3

Figure 2:
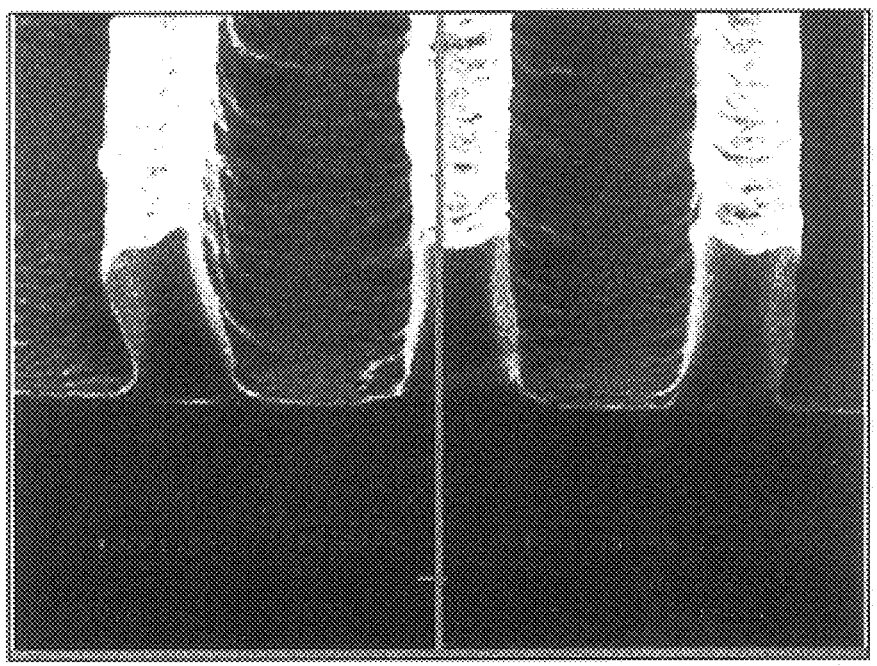
FIG. 2 is a scanning electron micrograph of 200 nm nested features imaged with the compositions of the present invention.
Figure 3:
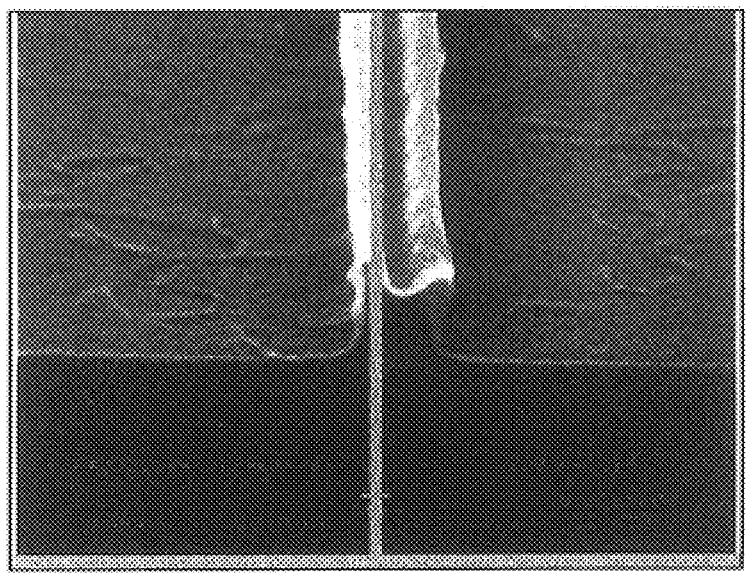
FIG. 3 is a scanning electron micrograph of a 200 nm isolated feature imaged with the compositions of the present invention.

The photoresist composition from Example 2 was coated on a silicon wafer containing an antireflective coating layer (AR3™ brand antireflective coating, available from Shipley Company, Marlborough, Mass.). The photoresist was coated to a thickness of 4500 Å and soft baked at 130° C. for 60 seconds. The photoresist was then exposed at 248 nm through a mask to provide 200 nm features having 1:1 aspect ratios. The exposure energy was 22.6 mJ/cm$^2$. Following exposure, the photoresist was developed using 0.26 N tetramethylammonium hydroxide. No swelling of the polymer was observed. FIG. 2 is a scanning electron micrograph ("SEM") of nested 200 nm features and FIG. 3 is a SEM of an isolated 200 nm feature. These figures clearly show that the polymeric particle binders of the present invention can be imaged.

EXAMPLE 4

A plurality of nanogel polymer particles prepared by solution polymerization and having the composition MMA/HEMA/ALMA (45/45/10 percent by weight based on the total weight of the monomers) (2.87 g) was charged into a 250 milliliter ("mL") round bottom flask and then ethanol (60 mL) was added to the flask in small aliquots. After shaking for 10 minutes, the polymer dissolved. Water (40 mL) was then added dropwise to the flask. Initially upon addition of the water, the solution became cloudy but became clear upon shaking. After half the water had been added, the solution became cloudy. Following addition of all the water, the ethanol was slowly removed by rotary evaporation. Upon removal of the ethanol, the solution was filtered to obtain a non-aggregated white emulsion, visibly free of suspended polymer particles. Solution solids were determined to be 7 weight percent. No surfactant was added to stabilize the emulsion.

What is claimed is:

1. A photoresist composition comprising a plurality of cross-linked polymeric particles and a photoactive component, wherein the polymeric particles comprise one or more cleavable groups and wherein the composition is substantially free of surfactant.

2. The composition of claim 1 wherein the polymeric particle further comprises one or more fluorinated monomers or fluorinated cross-linking agents.

3. The composition of claim 2 wherein the fluorinated monomer is selected from fluoroalkyl (meth)acrylate, fluorocycloalkyl (meth)acrylate, fluoroalkylsulfoamidoethyl (meth)acrylate, fluoroalkylamidoethyl (meth)acrylate, fluoroalkyl (meth)acrylamide, fluoroalkylpropyl (meth)acrylate, fluoroalkylethyl poly(alkyleneoxide) (meth)acrylate, fluoroalkylsulfoethyl (meth)acrylate, $\alpha H, \alpha H, \omega H, \omega H$-perfluoroalkanediol di(meth)acrylate, β-substituted fluoroalkyl (meth)acrylate, fluorinated vinyl ethers, fluorinatedalcohol vinyl ethers, fluorinated vinyl acetates, fluorinatedalkyl vinyl acetates, fluorinated aromatics, fluorinated hydroxy-aromatics, fluorinated ethylene, fluorinated α-olefins, fluorinated dienes or fluorinated heterocycles.

4. The composition of claim 3 wherein the fluorinated monomer is selected from fluoro($C_1$–$C_{20}$)alkyl (meth) acrylate, fluoroalkylpropyl (meth)acrylate, fluoroalkylethyl vinyl ether, fluoroalkylethyl poly(ethyleneoxide)vinyl ether; fluorostyrene, pentafluoro styrene, fluoroalkyl styrene; fluoroalkyl hydroxystyrene, perfluorobutadiene, 1-fluoroalkylperfluorobutadiene, vinylidene fluoride, trifluoromethyl vinyl acetate, trifluoroethylene, tetrafluoroethylene, perfluoro-(2,2-dimethyl-1,3-dioxole) and perfluoro-(2-methylene-4-methyl-1,3-dioxolane).

5. The composition of claim 1 further comprising one or more organic solvents.

6. The composition of claim 1 wherein the polymeric particles have a mean particle size in the range of from about 1 to about 1000 nm.

7. The composition of claim 6 wherein the mean particle size is in the range of from about 1 to about 200 nm.

8. The composition of claim 7 wherein the mean particle size is in the range of from about 1 about 50 nm.

9. The composition of claim 1 wherein the polymeric particles have a polydispersity of from about 1 to 20.

10. The composition of claim 9 wherein the polydispersity is from about 1.0001 to 10.

11. The composition of claim 1 wherein the polymer particles are nanoparticles, nanogels or core-shell particles.

12. The composition of claim 11 wherein the core-shell particles comprise one or more photoacid generators as core material.

13. A method for forming a photoresist relief image, comprising the steps of applying a coating layer of a photoresist composition comprising a plurality of cross-linked polymeric particles and a photoactive component, wherein the polymeric particles comprise one or more cleavable groups and wherein the photoresist composition is substantially free of a surfactant; exposing the photoresist coating layer to patterned activating radiation; and developing the exposed photoresist coating layer to provide a photoresist relief image.

14. The method of claim 13 wherein the polymeric particle further comprises one or more fluorinated monomers or fluorinated cross-linking agents.

15. The method of claim 13 wherein the polymeric particles have a mean particle size in the range of from about 1 to about 1000 nm.

16. The method of claim 13 wherein the activating radiation has a wavelength of 157 nm.

17. A plurality of core-shell polymeric particles comprising one or more photoactive components as core-material, wherein the plurality of core-shell polymeric particles has a mean particle size of about 1 to about 20 nm.

18. A photoresist composition comprising a plurality of core-shell polymeric particles and a photoactive component, wherein the polymeric particles comprise one or more cleavable groups.

19. The composition of claim 18 further comprising one or more organic solvents.

20. The composition of claim 18 wherein the polymeric particles have a mean particle size in the range of from about 1 to about 1000 nm.

21. The composition of claim 18 wherein the polymeric particles have a polydispersity of from about 1.0001 to 10.

22. The composition of claim 18 wherein the polymeric particle further comprises one or more fluorinated monomers or fluorinated cross-linking agents.

23. The composition of claim 22 wherein the fluorinated monomer is selected from fluoroalkyl (meth)acrylate, fluorocycloalkyl (meth)acrylate, fluoroalkylsulfoamidoethyl (meth)acrylate, fluoroalkylamidoethyl (meth)acrylate, fluoroalkyl (meth)acrylamide, fluoroalkylpropyl (meth)acrylate, fluoroalkylethyl poly(alkyleneoxide) (meth)acrylate, fluoroalkylsulfoethyl (meth)acrylate, $\alpha H,\alpha H,\omega H,\omega H$-perfluoroalkanediol di(meth)acrylate, $\beta$-substituted fluoroalkyl (meth)acrylate, fluorinated vinyl ethers, fluorinatedalcohol vinyl ethers, fluorinated vinyl acetates, fluorinatedalkyl vinyl acetates, fluorinated aromatics, fluorinated hydroxy-aromatics, fluorinated ethylene, fluorinated $\alpha$-olefins, fluorinated dienes or fluorinated heterocycles.

24. A method for forming a photoresist relief image, comprising the steps of applying a coating layer of a photoresist composition comprising a plurality of core-shell polymeric particles and a photoactive component, wherein the polymeric particles comprise one or more cleavable groups; exposing the photoresist coating layer to patterned activating radiation; and developing the exposed photoresist coating layer to provide a photoresist relief image.

25. The method of claim 24 wherein the core-shell polymeric particles have a mean particle size in the range of from about 1 to about 1000 nm.

26. The method of claim 24 wherein the core-shell polymeric particles have a polydispersity of from about 1.0001 to 10.

27. The method of claim 24 wherein the core-shell polymeric particle further comprises one or more fluorinated monomers or fluorinated cross-linking agents.

28. A photoresist composition comprising a plurality of cross-linked polymeric particles and a photoactive component, wherein the polymeric particles comprise one or more cleavable groups and wherein the composition is substantially free of solvent.

29. A method for manufacturing an electronic device comprising the steps of disposing on the surface of a substrate a photoresist composition comprising a plurality of cross-linked polymeric particles and a photoactive component, wherein the polymeric particles comprise one or more cleavable groups and wherein the photoresist composition is substantially free of surfactant; exposing the photoresist coating layer to patterned activating radiation; and developing the exposed photoresist coating layer to provide a photoresist relief image.

30. The method of claim 29 wherein the polymeric particle further comprises one or more fluorinated monomers or fluorinated cross-linking agents.

31. The method of claim 29 wherein the polymeric particles have a mean particle size in the range of from about 1 to about 1000 nm.

32. The method of claim 29 wherein the polymeric particles have a polydispersity of from about 1.0001 to 10.

33. A method for manufacturing an electronic device comprising the steps of disposing on the surface of a substrate a photoresist composition comprising a plurality of core-shell polymeric particles and a photoactive component wherein the polymeric particles comprise one or more cleavable groups; exposing the photoresist coating layer to patterned activating radiation; and developing the exposed photoresist coating layer to provide a photoresist relief image.

34. The method of claim 33 wherein the core-shell polymeric particle further comprises one or more fluorinated monomers or fluorinated cross-linking agents.

35. The method of claim 33 wherein the core-shell polymeric particles have a mean particle size in the range of from about 1 to about 1000 nm.

36. The method of claim 33 wherein the core-shell polymeric particles have a polydispersity of from about 1.0001 to 10.

37. A photoresist composition comprising a plurality of cross-linked solution polymer particles and a photoactive component, wherein the polymer particles comprise one or more cleavable groups.

38. A photoresist composition comprising a plurality of cross-linked polymer particles and a photoactive component, wherein the plurality of cross-linked polymer particles has a mean particle size of about 1 to about 200 nm.

39. The photoresist composition of claim 38 further comprising a cross-linking agent.

40. The photoresist composition of claim 38 wherein the cross-linked polymer particles comprise one or more cleavable groups.

* * * * *